United States Patent [19]

Inomata et al.

[11] Patent Number: 5,093,571

[45] Date of Patent: Mar. 3, 1992

[54] METHOD AND DEVICE FOR ANALYZING GAS IN PROCESS CHAMBER

[75] Inventors: Juro Inomata, Mizusawa; Masaru Nakamura, Kitakami, both of Japan

[73] Assignee: Fujitsu Limited, Kawasaki, Japan

[21] Appl. No.: 546,805

[22] Filed: Jul. 2, 1990

[30] Foreign Application Priority Data

Jul. 3, 1989 [JP] Japan .................................. 1-172173

[51] Int. Cl.$^5$ ............................................. H01J 49/04
[52] U.S. Cl. .................................... 250/288; 250/289; 250/282
[58] Field of Search .................. 250/288, 288 A, 289, 250/281, 282

[56] References Cited

FOREIGN PATENT DOCUMENTS 61-130485 6/1986 Japan .

OTHER PUBLICATIONS

Maliakai, *Research/Development*, May 1976, pp. 57–60.

Primary Examiner—Jack I. Berman
Attorney, Agent, or Firm—Armstrong, Nikaido, Marmelstein, Kubovcik & Murray

[57] ABSTRACT

A gas in a process chamber, such as a sputtering chamber, having a typical inside pressure of $10^{-1}$ to $10^{-3}$ Torr, is analyzed by a mass spectrometer, which should be used at a pressure range of lower than around $10^{-4}$ Torr. The method comprises evacuating a process chamber by a vacuum pump and supplying a gas to the process chamber, whereby a pressure in the process chamber is determined by the vacuum pump and the supplied gas, and that pressure in the process chamber is higher than a pressure in the vacuum pump, and analyzing the gas at a portion of or around the vacuum pump, which portion has a pressure lower than the pressure in the process chamber, by using a mass spectrometer.

16 Claims, 8 Drawing Sheets

METHOD AND DEVICE FOR ANALYZING GAS IN PROCESS CHAMBER

BACKGROUND OF THE INVENTION

1. Field of the Invention

The present invention relates to a method and device for analyzing a gas in a process chamber such as a sputtering or reactive ion etching chamber.

2. Description of the Related Art

In the development of electronic devices involving semiconductor integrated circuits, vacuum devices have become essential to the process of manufacturing such electronic devices, which comprises a step of treating a semiconductor in a vacuum chamber or in a gas atmosphere formed by first evacuating a chamber and then introducing a gas into the chamber.

In such various devices utilizing a special atmosphere, including a vacuum atmosphere, the degree of the vacuum in a process chamber must be extremely high (a pressure less than $10^{-10}$ Torr), compared to a usual high vacuum, and this requirement is essential to the obtaining of a semiconductor device having a greater efficiency, a higher density, and a higher quality. Further, an improvement of the quality of an atmosphere in a process chamber and an improvement of the quality of vacuum in the chamber, as a basis of the atmosphere, is critical.

One essential basic factor in the improvement of the vacuum quality is, of course, a gas-tight sealing of the vacuum system from the outside; another is the efficiency and precision of a measurement of the atmosphere in a vacuum system, particularly in a process chamber. Note, the measurement of the atmosphere in a process chamber involves a gas analysis and a gas leakage detection.

An ionization vacuum gauge is known as a means for measuring an atmospheric pressure or a degree of vacuum, but the ionization vacuum gauge cannot analyze a gas in a chamber.

Currently, in addition to a process in a vacuum chamber, a gas atmosphere is often used in another process, for example, a reactive ion etching or a chemical vapor deposition (CVD), and a mass spectrometer is often used for an analysis of such a gas atmosphere. A mass spectrometer is an analyzer utilizing an electromagnetic interaction to detect atoms and molecules by the mass of ions thereof, and is available in several types; a residual gas analyser: RGA (qued pole mas filter; Q-mass) is often used.

Figure 1:
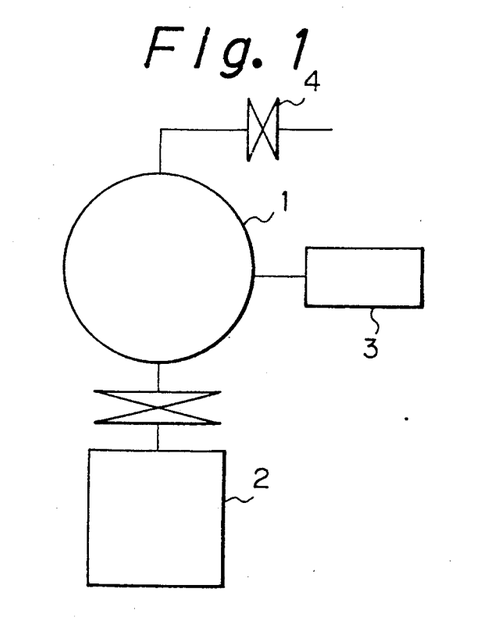
FIG. 1 shows a system in which a gas in a process chamber is directly analyzed by a mass spectrometer.

FIG. 1 illustrates a gas analysis system using a mass spectrometer. In this figure, 1 denotes a process chamber, 2 an evacuating means, 3 a mass spectrometer, and 4 a valve for introducing a gas into and controlling the atmosphere in the process chamber 1. The inside of the process chamber 1 is originally open to the surrounding air, at a pressure of 760 Torr, and is first evacuated by a roughing vacuum pump such as an oil-sealed rotary vacuum pump to, for example, $10^{-3}$-$10^{-4}$ Torr. Then, the roughing vacuum pump is replaced by a high degree vacuum pump, such as an oil or mercury diffusion vacuum pump or various ion pumps, to obtain a high vacuum, e.g., $10^{-5}$ Torr or $10^{-8}$ Torr, or even an ultra high vacuum higher than $10^{-10}$ Torr (a pressure lower than $10^{-10}$ Torr). After obtaining such an ultra high vacuum, a process gas is introduced through the valve 4 into the process chamber 1 and a process treatment is carried out at a predetermined degree of vacuum.

Figure 2:
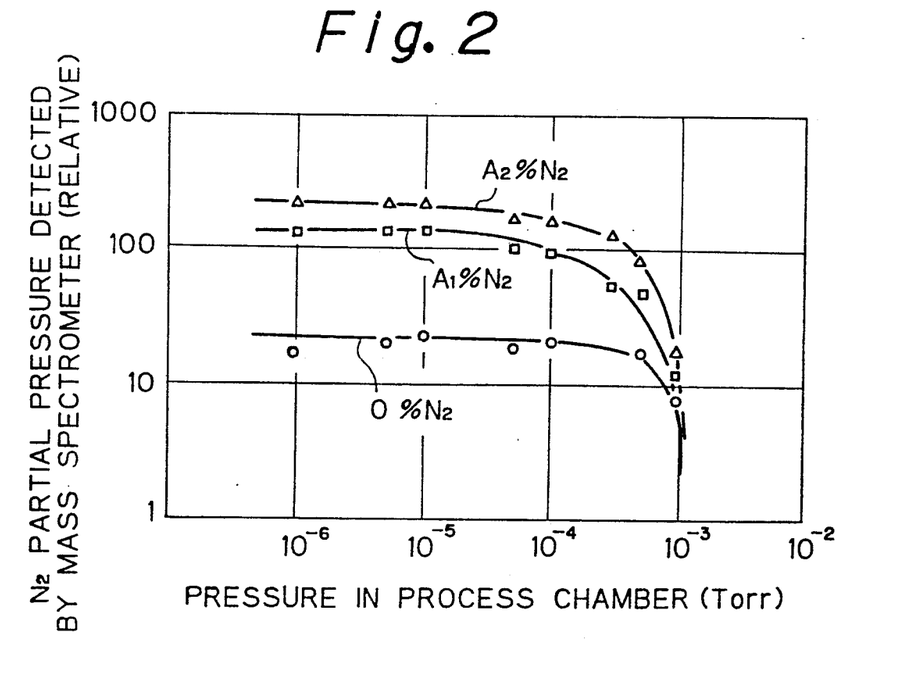
FIG. 2 shows a general relationship between the gas partial pressure analyzed by the mass spectrometer and the degree of vacuum in the process chamber, obtained by the system shown in FIG. 1.

FIG. 2 shows a general relationship between the nitrogen gas partial pressure analyzed by the mass spectrometer and the degree of vacuum in the process chamber, as obtained by the system shown in FIG. 1. Namely, an argon gas mixed with a nitrogen gas at a content of 0%, $A_1$%, or $A_2$% ($A_1 < A_2$) (nitrogen leakage 0%, $A_1$%, $A_2$%) was introduced through the valve 4 and the nitrogen partial pressure, expressed as a relative value, was measured by the mass spectrometer 3 while the degree of vacuum (in Torr unit) in the process chamber was varied by varying a flow rate of the argon gas. It can be seen from FIG. 2 that, as the degree of vacuum in the process chamber 1 is reduced (pressure increased), the measured nitrogen partial pressures for the nitrogen contents 0%, $A_1$% and $A_2$% begin to reduce from predetermined degrees of vacuum points, respectively, and the reduction of the partial pressure of the nitrogen content $A_2$% begins first, followed by that of $A_1$%, and finally, that of 0%. The relationship shown in FIG. 2 is the essential characteristic of a mass spectrometer, and therefore, it is generally considered that a mass spectrometer should not be used at a pressure higher than about $10^{-3}$ Torr, and preferably, is used at a pressure lower than around $10^{-4}$ Torr, more preferably lower than around $10^{-5}$ Torr. This is because a mass spectrometer analyzes atoms and molecules by utilizing a movement of ions of the atoms and molecules in a high vacuum (a low pressure).

Nevertheless, a process such as sputtering or reactive ion etching usually must be carried out at a degree of vacuum of about $10^{-1}$ to $10^{-3}$ Torr, and therefore, a mass spectrometer is not suitable for an analysis of a gas in such a process chamber, i.e., at a low degree of vacuum of about $10^{-1}$ to $10^{-3}$ Torr.

To enable the use of a mass spectrometer for analyzing a gas in a process chamber, a method is known of increasing the degree of vacuum around a mass spectrometer to be more than that in the process chamber (e.g., see Japanese Unexamined Patent Publication (Kokai) No. 61-130485).

Figure 3:
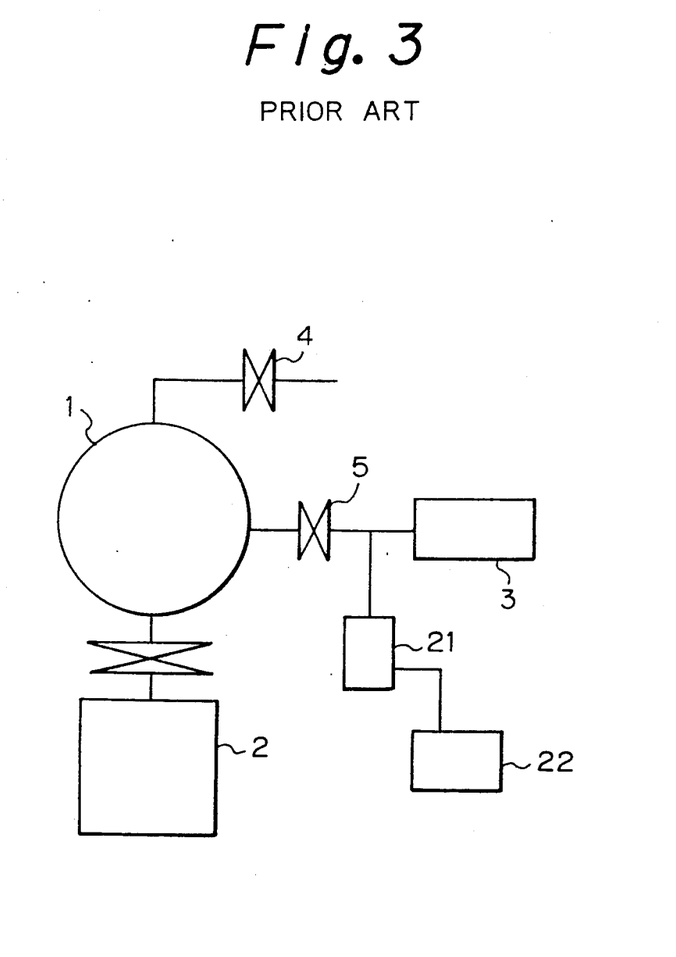
FIG. 3 shows a prior art system of analyzing a gas in a process chamber by a mass spectrometer.

FIG. 3 illustrates such a prior art system for analyzing a gas by a mass spectrometer. In this figure, separate vacuum means 21 and 22, independent of the vacuum means 2 for evacuating the process chamber 1, are provided to evacuate the gas around the mass spectrometer 3. Namely, a flow rate control valve (a pressure difference of, e.g., 1/1000) 5 is provided in a line from the process chamber 1 to the mass spectrometer 3 and a line is branched from a portion between the valve 5 and the mass spectrometer 3 and is connected to higher and lower degree vacuum pumps 21 and 22, whereby while the degree of vacuum in the process chamber 1 is, for example, $10^{-2}$ Torr or $10^{-3}$ Torr, the degree of vacuum at the mass spectrometer 3 can be, for example, $10^{-5}$ Torr or $10^{-6}$ Torr. Here, the higher degree vacuum pump 21 is a turbo molecular drag pump having a turbine wing comprised of a rotor and a stator, and the lower degree vacuum pump 22 is an oil rotary vacuum pump, whereby the mass spectrometer 3 can be operated in an atmosphere having a required high degree of vacuum (a low pressure).

Figure 4:
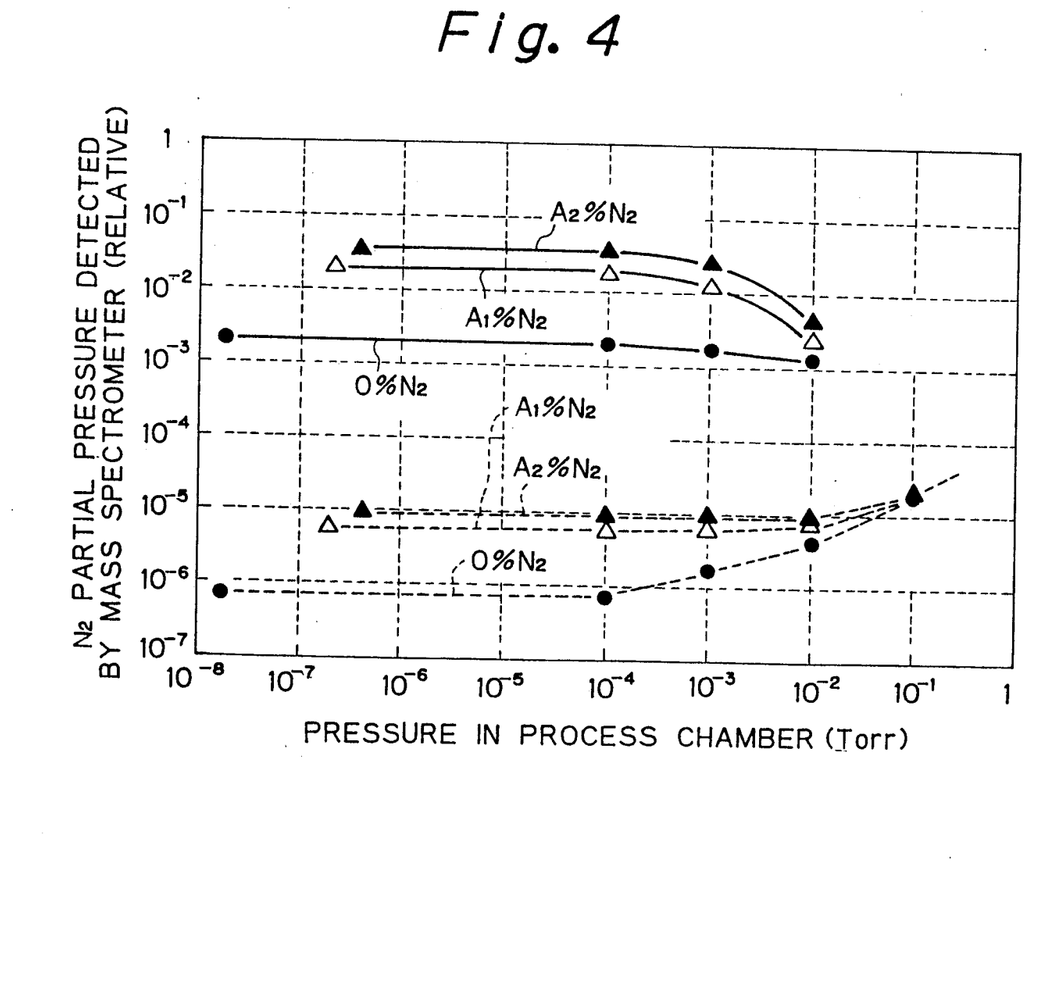
FIG. 4 shows relationships between the gas partial pressure analyzed by the mass spectrometer and the degree of vacuum in the process chamber, in the systems shown in FIGS. 3 and 6.
Figure 5:
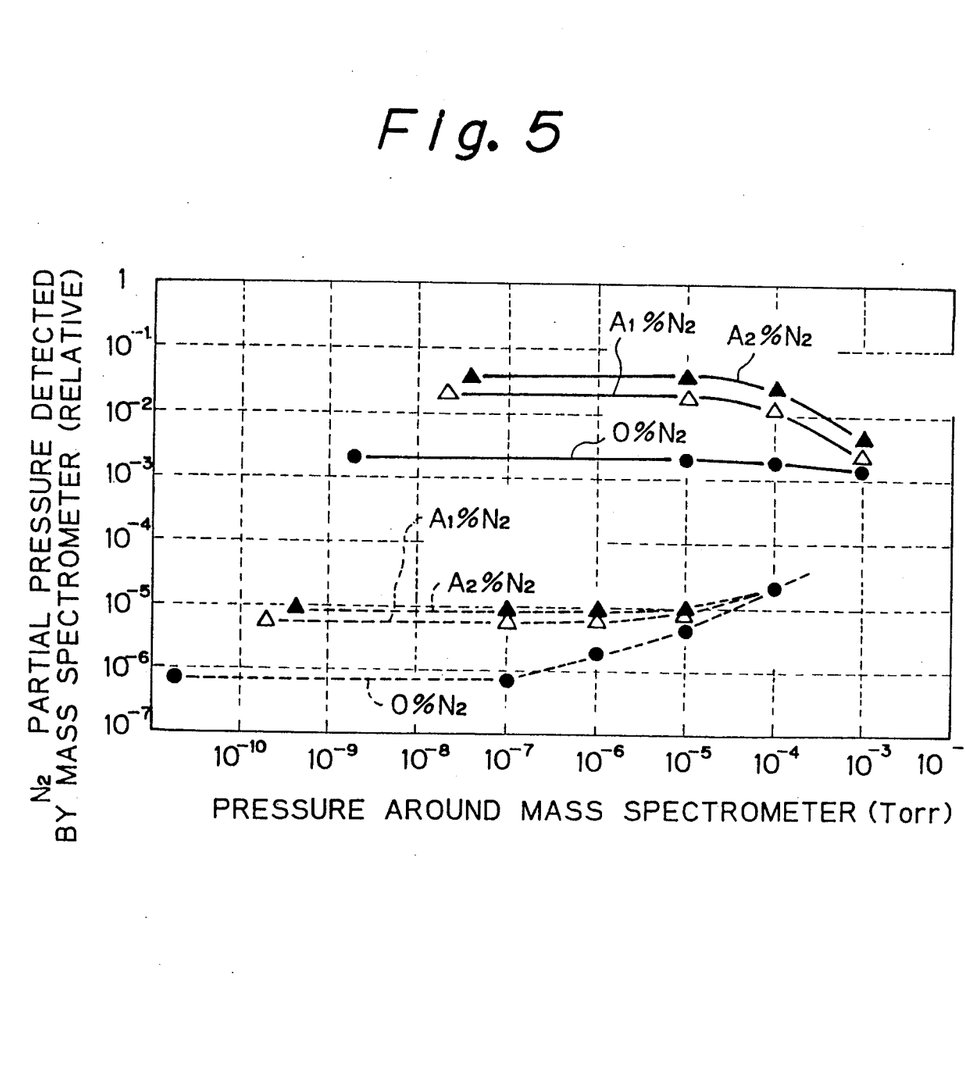
FIG. 5 shows relationships between the gas partial pressure analyzed by the mass spectrometer and the degree of vacuum at the portion of the mass spectrometer, in the systems shown in FIGS. 3 and 6.

FIG. 4 shows a relationship between the nitrogen gas partial pressure analyzed by the mass spectrometer and the degree of vacuum in the process chamber, in a system as shown in FIG. 3. This was also obtained by introducing an argon gas mixed with a nitrogen gas at a content of 0%, $A_1$%, or $A_2$% ($A_1 < A_2$), while the vacuum pressure in the process chamber 1 was varied by varying a flow rate of the argon gas. The nitrogen partial pressure was analyzed by the mass spectrometer 3 at various degrees of vacuum Torr unit) of the process chamber 1, and expressed at a relative value. It can be seen from FIG. 4 that, when the pressure in the process chamber is increased from $10^{-4}$ Torr to $10^{-1}$ Torr (a degree of vacuum of from $10^{-4}$ Torr to $10^{-4}$ Torr), although the pressure for the mass spectrometer is then sufficiently low, at $10^{-7}$ Torr to $10^{-4}$ Torr, the nitrogen partial pressure at the zero nitrogen leakage is increased and the difference between the measured nitrogen partial pressures becomes smaller. FIG. 5 shows the relationship between the nitrogen gas partial pressure analyzed by the mass spectrometer and the degree of vacuum around the mass spectrometer, in a system as shown in FIG. 3, and this relationship corresponds to that in FIG. 4 with a pressure difference of $10^{-3}$ Torr between the process chamber and the mass spectrometer. This suggests that, when the degree of vacuum in the process chamber 1 is lower than $10^{-4}$ Torr or less (a pressure higher than $10^{-4}$ Torr), the nitrogen contents of the gases in the process chamber 1 and in the mass spectrometer 3 are not equivalent, and thus that the analysis of a gas in the process chamber 1 is not reliable within that pressure range. This unreliability of an analysis in the system as shown in FIG. 3 is different from the characteristic of the mass spectrometer shown in FIG. 2, and is derived from the system structure.

The object of the present invention is to provide a method and device for correctly analyzing a gas in a process chamber having a low degree of vacuum, e.g., $10^{-4}$ Torr or lower (a pressure of $10^{-4}$ Torr or higher) or even $10^{-3}$ Torr or lower (a pressure of $10^{-3}$ Torr or higher), by using a mass spectrometer.

SUMMARY OF THE INVENTION

The above and other objects of the present invention are attained by a method of analyzing a gas, comprising the steps of evacuating a process chamber by a vacuum means and supplying a gas to the process chamber, whereby a pressure in the process chamber is determined by the vacuum means and the supplied gas, and that pressure in the process chamber is higher than a pressure in the vacuum means, and analyzing the gas at a portion of or around the vacuum means, which portion has a pressure lower than the pressure in the process chamber, by using a mass spectrometer.

In another aspect of the present invention, there is provided a device for analyzing a gas in a process chamber, comprising a process chamber, a means for supplying a gas to the process chamber, and a vacuum means for evacuating the process chamber, wherein a pressure in the process chamber is determined by the vacuum means and the supplied gas, and that pressure in the process chamber is higher than a pressure in the vacuum means, and a mass spectrometer connected to a portion of or around the vacuum means, which portion has a pressure lower than the pressure in the process chamber.

In a preferred embodiment, the pressure in the process chamber is preferably $10^{-4}$ Torr or higher, most preferably $10^{-3}$ Torr to $10^{-1}$ Torr, and the pressure at the portion at which the gas is analyzed by the mass spectrometer is preferably $10^{-4}$ Torr or lower, more preferably $10^{-5}$ Torr or lower. According to the method and device of the present invention, although the pressure of a gas at the portion at which the gas is analyzed is low enough to enable the use of a mass spectrometer, e.g., $10^{-4}$ Torr or lower, even $10^{-5}$ Torr or lower, and the pressure in the process chamber is high enough to carry out a desired process treatment, e.g., $10^{-4}$ Torr or higher, typically $10^{-3}$ Torr to $10^{-1}$ Torr, the analysis obtained of the high gas pressure in the process chamber properly represents the gas in the process chamber, and thus a correct analysis of a gas in a process chamber by a mass spectrometer is obtained.

DESCRIPTION OF THE PREFERRED EMBODIMENTS

Figure 6:
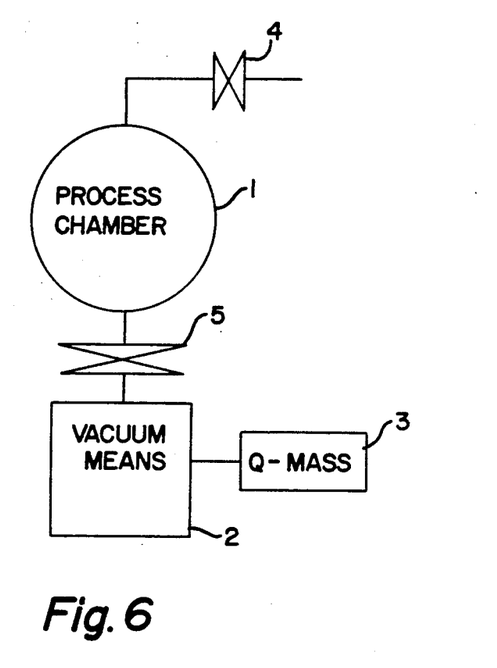
FIG. 6 shows a system for analyzing a gas in a process chamber by a mass spectrometer, according to the present invention.

FIG. 6 illustrates an example of an analysis system of the present invention, which is similar to the system shown in FIG. 1 except that the mass spectrometer 3 is connected directly to the vacuum means 2, not to the process chamber 1.

Figure 7:
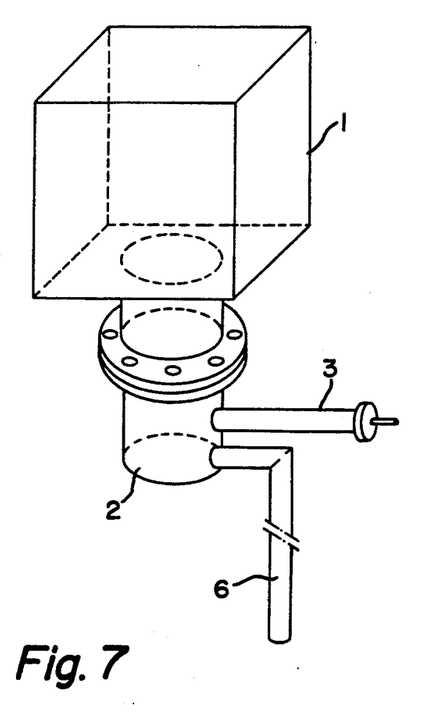
FIG. 7 is a perspective view of the system for analyzing a gas in a process chamber by a mass spectrometer, shown in FIG. 6.
Figure 8:
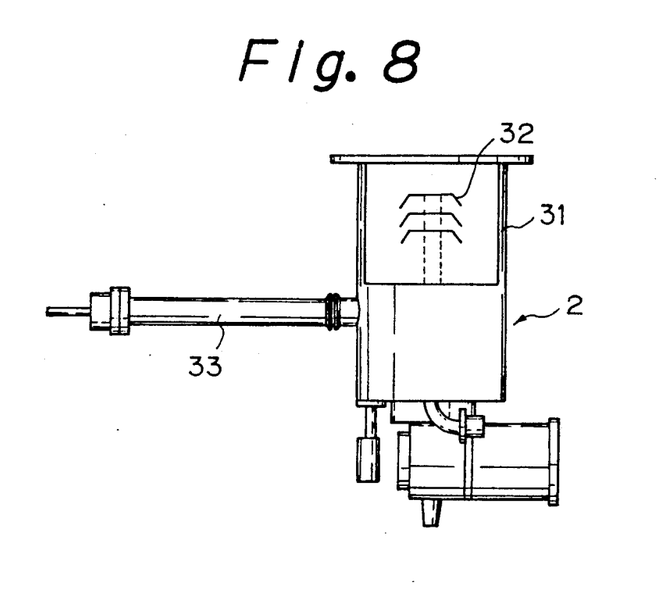
FIG. 8 is a partial view of the system shown in FIG. 7.
Figure 9:
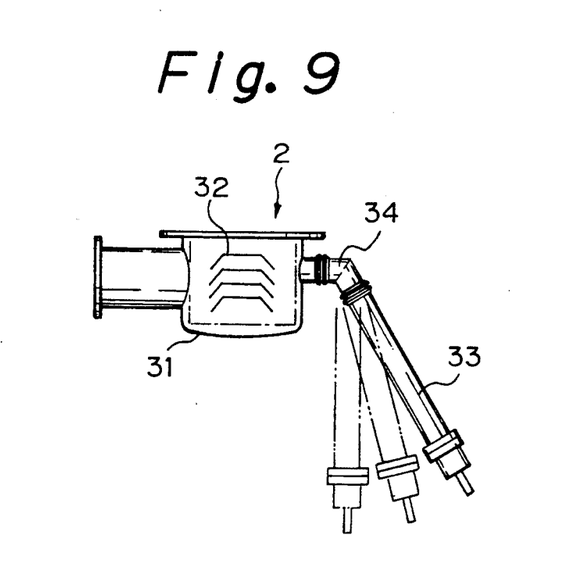
FIG. 9 is a partial view of a modified embodiment of the system shown in FIG. 7.

FIG. 7 is a perspective view of this system, which further includes a vacuum line 6. The process chamber 1 is an aluminum sputtering device and the vacuum means 2 is a cryo pump which captures gaseous molecules by adsorption. The mass spectrometer 3 (more specifically, a sensor portion of the mass spectrometer) is connected to a side wall of the cryo pump 2. FIG. 8 shows this connection of the mass spectrometer 3 to the cryo pump 2, in which the cryo pump 2 is shown in section. The cryo pump 2 comprises first and second stages 31 and 32, which are cooled to adsorb molecules. The sensor 33 of the mass spectrometer is connected at a portion remote from the stages 31 and 32, so that the heat of a filament of the sensor 33 does not affect the stages 31 and 32. Alternatively, the sensor 33 may be connected to a portion near the stages 31 and 32, provided that an elbow flange 34, for example, is disposed between the cryo pump 2 and the sensor 33 to ensure that the heat of the filament of the sensor 33 does not affect the stages 31 and 32.

A flow rate control valve 5 is provided between the process chamber 1 and the vacuum means 2, and the valve 5 is adjusted to form a pressure difference of 1/100.

FIG. 4 shows a relationship between the nitrogen partial pressure analyzed by the mass spectrometer 3 and the degree of vacuum in the process chamber 1 in the system shown in FIG. 6 or 7. This relationship was obtained by introducing an argon gas mixed with a nitrogen gas at a content of 0%, $A_1$%, or $A_2$% ($A_1 < A_2$), while the vacuum pressure in the process chamber 1 was varied by varying a flow rate of the argon gas. The nitrogen partial pressure was analyzed by the mass spectrometer 3 at various degrees of vacuum (Torr unit) of the process chamber 1, and expressed as a relative value. It can be seen from FIG. 4 that the nitrogen partial pressure in the case of the 0% $N_2$ leakage was not increased even if the pressure in the process chamber 1 was increased from $10^{-4}$ Torr to $10^{-3}$ Torr or to $10^{-2}$ Torr, although such an increase occurs in the prior art system shown in FIG. 3. It also can be seen that the nitrogen partial pressures in the cases of the $A_1$% and $A_2$% $N_2$ leakages are reduced within a pressure range of from $10^{-4}$ Torr to $10^{-2}$ Torr. FIG. 5 also shows the relationship between the gas partial pressure analyzed by the mass spectrometer and the degree of vacuum at the portion of the mass spectrometer, in a system as shown in FIG. 6 or 7, and this relationship corresponds to that in FIG. 4 with a pressure difference of $10^{-2}$ Torr between the process chamber and the mass spectrometer. It also can be seen that the curves of the present invention in FIG. 5 are similar to the curves shown in FIG. 2. Namely, the reduction of the nitrogen partial pressures in the cases of the $A_1$% and $A_2$% $N_2$ leakages in a pressure range of from $10^{-4}$ Torr to $10^{-2}$ Torr in FIG. 4 is similar to that seen in FIG. 2, i.e., is the essential characteristic of a mass spectrometer, and does not cause a problem during the measurement. Therefore, the analysis carried out at a pressure lower than $10^{-2}$ Torr in the process chamber, corresponding to a pressure lower than $10^{-4}$ Torr at a portion of the mass spectrometer 3, in the system shown in FIG. 6 or 7, is very reliable.

Furthermore, it should be noted that the intensity of the measurement in the system of the present invention is more than 103 times higher than that in the prior art system, which is another important advantage of the present invention. This is advantageous because a sensitivity of the measurement is higher, or an measurement can be made even at a lower leakage rate.

It also should be noted that, in the above example, the pressure difference between the process chamber 1 and the vacuum means 2 is 1/100, but this is not limited and may be varied depending on the system, etc. Therefore it is possible that a pressure in a process chamber can be around $10^{-1}$ Torr, while a pressure at a portion of a mass spectrometer can be less than $10^{-4}$ Torr, and that a pressure in a process chamber can be around $10^{-3}$ Torr while a pressure at a portion of a mass spectrometer can be less than $10^{-5}$ Torr.

Figure 10:
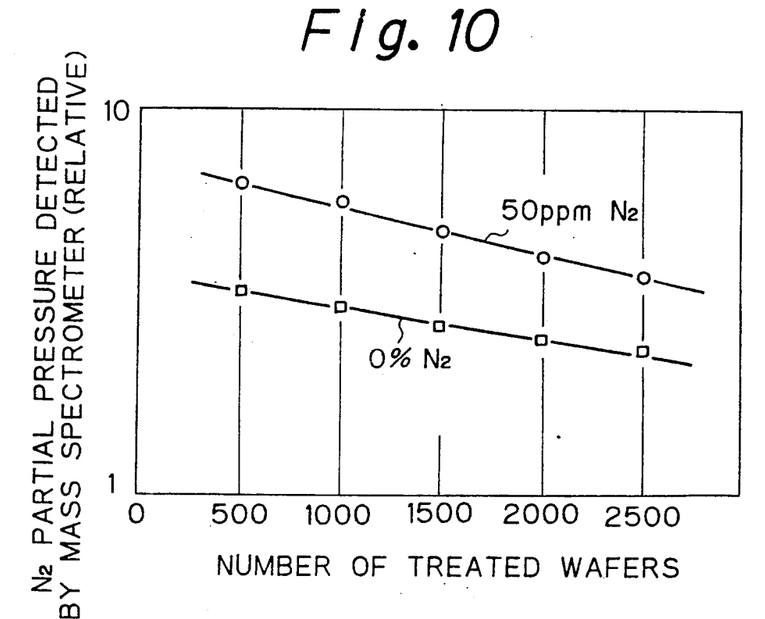
FIG. 10 shows a relationship between the analyzed nitrogen partial pressure and the number of silicon wafers treated.

In the system shown in FIG. 6 or 7, an aluminum sputtering was carried out onto silicon wafers while the gas in the process chamber 1 was being analyzed by the mass spectrometer 3. The pressure in the center of the cryo pump 3 was $3.5 \times 10^{-5}$ Torr and the pressure in the process chamber 1 was adjusted to $7 \times 10^{-3}$ Torr by an argon gas leakage from the valve 4; a nitrogen content of the argon gas being 0% or 50 ppm. FIG. 10 shows a relationship between the analyzed nitrogen partial pressure (relative value) and the number of silicon wafers treated. The lines of the 0% and 50 ppm $N_2$ contents are almost parallel and clearly separated, and this shows that the gas analyzing system of the present invention is industrially useful.

Although in the above system the mass spectrometer 3 was disposed at a side wall of the cryo pump 2, the mass spectrometer 3 may be disposed between the valve 5 and the cryo pump 2 or at the vacuum line 6, as long as the pressure thereat is low enough to enable the use of a mass spectrometer 3, i.e., less than around $10^{-4}$ Torr, preferably less than $10^{-5}$ Torr. Further, the mass spectrometer 3 may be connected to a bypass line (not shown) from the cryo pump 2 and a line between the cryo pump 2 and the valve 5.

Figure 11:
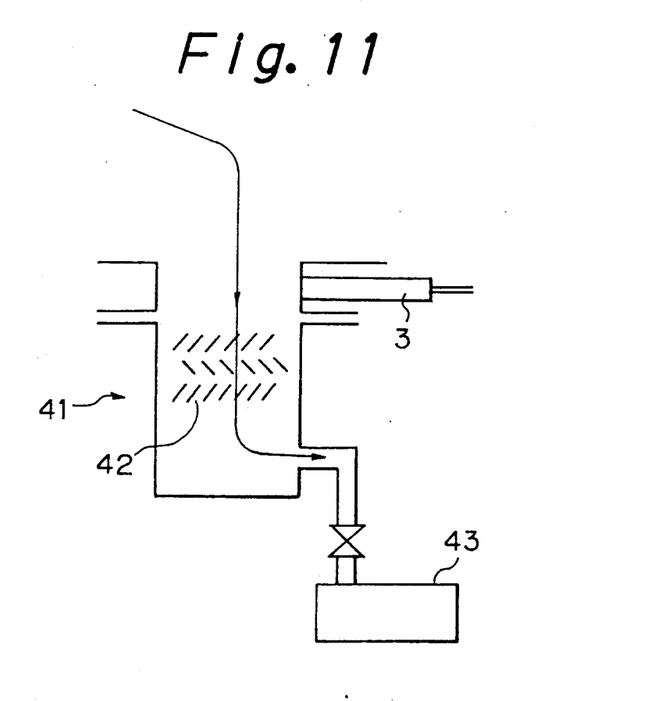
FIG. 11 is a schematic partial view of another modified embodiment of the system shown in FIG. 7.

Further, the vacuum means 2 may be a turbo molecule pump. FIG. 11 illustrates an example of a turbo molecule pump. In FIG. 11, a turbo molecule pump, generally indicated by 41, comprises a turbine rotor 42, and an auxiliary vacuum pump 43. In this system, a mass spectrometer 3 is preferably disposed at a side wall of the pump 41, before the turbine rotor 42, so that the pressure is kept sufficiently low.

Figure 12:
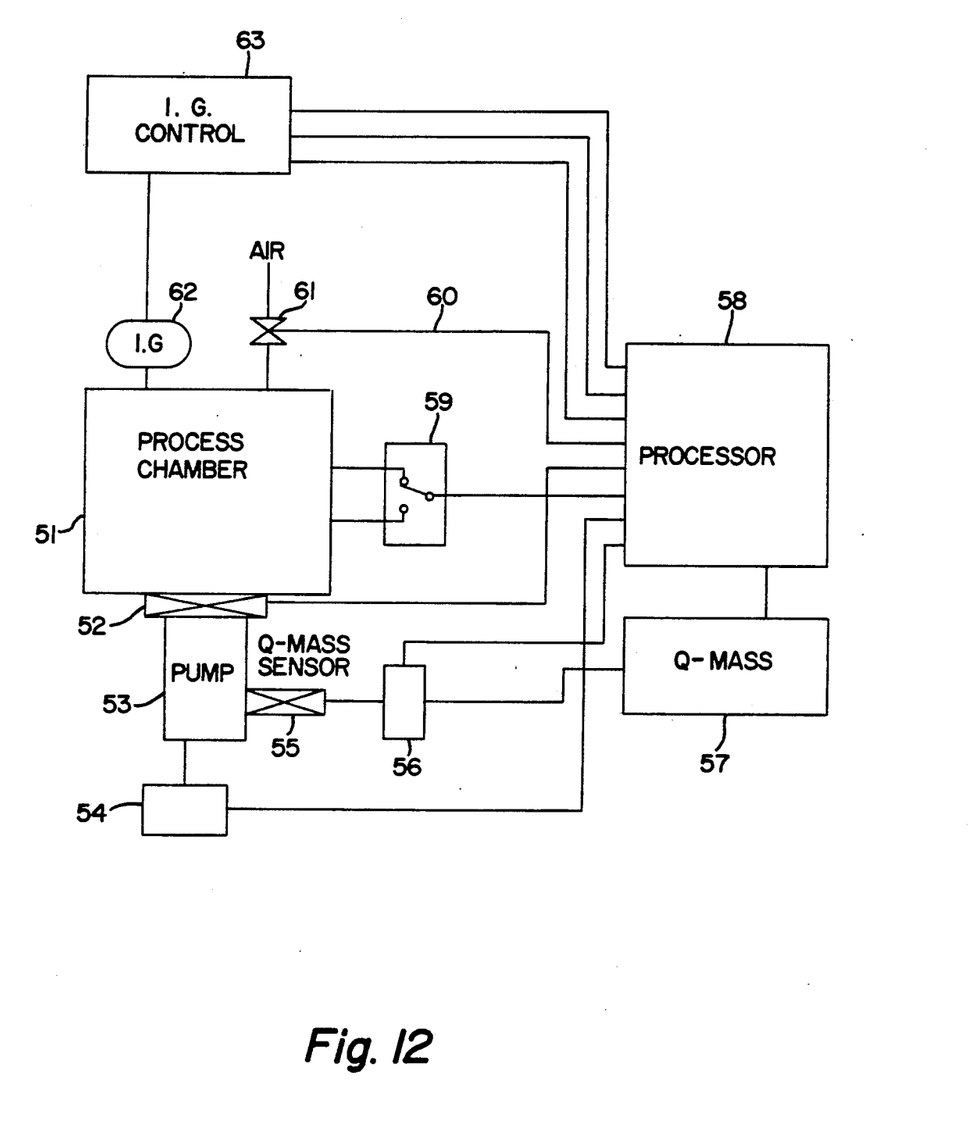
FIG. 12 is a schematic view of an automatic gas analysis and control system.

FIG. 12 shows an automatic control system of an atmosphere in a process chamber, using an analyzing system of the present invention. In FIG. 12, 51 denotes a process chamber, 52 a valve, 53 a cryo pump, 54 a temperature monitor, 55 a Q-mass sensor, 56 a line cutter, 57 a body of a mass spectrometer, 58 a processor (computer), 59 a chamber selector, 60 a master air line, 61 a valve for air control, 62 an ion gauge, and 63 an ion gauge control unit. In this system, the atmosphere in the process chamber 51 is analyzed by the mass spectrometer composed of the sensor 55 and the body 57, and the analyzed data is fed back to the ion gauge control unit 63 through the processor 58, so that the atmosphere in the process chamber 51 is controlled in real time.

We claim:

1. A method of analyzing a gas, comprising the steps of:
    evacuating a process chamber by a vacuum means, and supplying a gas to the process chamber,
    whereby a pressure in said process chamber is determined by said vacuum means and the supplied gas, and said pressure in said process chamber is higher than a pressure in said vacuum means, and
    analyzing the gas in a portion of said vacuum means, which portion has a pressure lower than said pressure in said process chamber, by means of a mass spectrometer.

2. A method according to claim 1, wherein the process chamber has a pressure not lower than $10^{-4}$ Torr.

3. A method according to claim 2, wherein the process chamber has a pressure of $10^{-3}$ to $10^{-1}$ Torr.

4. A method according to claim 1 or 2, wherein the portion at which the gas is analyzed has a pressure lower than $10^{-4}$ Torr.

5. A method according to claim 4, wherein the portion at which the gas is analyzed has a pressure lower than $10^{-5}$ Torr.

6. A method according to claim 1, wherein the mass spectrometer is provided at a side wall of said vacuum means, to analyze the gas in said vacuum means.

7. A method according to claim 1, further comprising the step of feeding back the analyzed data of the gas to control an atmosphere in the process chamber in real time.

8. A device for analyzing a gas in a process chamber, comprising:
- a process chamber,
- a means in communication with said process chamber for supplying a gas into said process chamber,
- a vacuum means in communication with said process chamber for evacuating said process chamber, whereby a pressure in said process chamber is determined by said vacuum means and said supplied gas, said pressure in said process chamber being higher than a pressure in said vacuum means, and
- a mass spectrometer arranged in a portion of said vacuum means for analyzing the gas being evacuated, which portion of said vacuum means has a pressure lower than said pressure in said process chamber.

9. A device according to claim 8, wherein the process chamber has a pressure not lower than $10^{-4}$ Torr.

10. A device according to claim 8, wherein the process chamber has a pressure of $10^{-3}$ to $10^{-1}$ Torr.

11. A device according to claim 8 or 9, wherein the portion at which the gas is analyzed has a pressure lower than $10^{-4}$ Torr.

12. A device according to claim 11, wherein the portion at which the gas is analyzed has a pressure lower than $10^{-5}$ Torr.

13. A device according to claim 8, wherein the vacuum means is a cryo pump.

14. A device according to claim 8, wherein the vacuum means is a turbo molecule pump.

15. A device according to claim 8, wherein the mass spectrometer is provided at a side wall of said vacuum means, to analyze the gas in said vacuum means.

16. A device according to claim 8, wherein the mass spectrometer is provided at a portion of a line between the process chamber and the vacuum means, to analyze the gas in said vacuum means.

* * * * *